United States Patent
Barnes et al.

(10) Patent No.: US 6,617,794 B2
(45) Date of Patent: Sep. 9, 2003

(54) METHOD FOR CONTROLLING ETCH UNIFORMITY

(75) Inventors: Michael Barnes, San Ramon, CA (US); John Holland, San Jose, CA (US); Valentin Todorov, Fremont, CA (US); Mohit Jain, San Jose, CA (US); Alexander Paterson, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/016,971

(22) Filed: Dec. 14, 2001

(65) Prior Publication Data

US 2002/0041160 A1 Apr. 11, 2002

Related U.S. Application Data

(63) Continuation-in-part of application No. 09/544,377, filed on Apr. 6, 2000, now Pat. No. 6,507,155.

(51) Int. Cl.[7] .................................................. H01J 7/24
(52) U.S. Cl. .............................. 315/111.21; 315/111.51; 118/723 R
(58) Field of Search ........................ 315/111.21, 111.41, 315/111.51, 111.71, 111.81; 118/723 I, 723 MP, 723 R

(56) References Cited

U.S. PATENT DOCUMENTS

| | | | |
|---|---|---|---|
| 4,629,940 A | 12/1986 | Gagne et al. | ............ 315/111.51 |
| 5,235,256 A | 8/1993 | Nuckolls | ..................... 315/326 |
| 5,290,382 A | 3/1994 | Zarowin et al. | ............. 156/345 |

(List continued on next page.)

FOREIGN PATENT DOCUMENTS

| | | | |
|---|---|---|---|
| EP | 0 742 577 | 11/1996 | ............ H01J/37/32 |
| JP | 07 086238 | 3/1995 | ....... H01L/21/3065 |
| WO | WO 00/36632 | 6/2000 | ............ H01J/37/32 |

OTHER PUBLICATIONS

Yamada et al., "Model for a Large Area Multi–Frequency Multiplanar Coil Inductively Coupled Plasma Source", J. Vac. Sci. Technol. A, Sep./Oct. 1996, pp. 2859–70.

PCT International Search Report from PCT/US 01/12178, Dated Jan, 25, 2002.

*Primary Examiner*—Don Wong
*Assistant Examiner*—Jimmy T. Vu
(74) *Attorney, Agent, or Firm*—Moser, Patterson & Sheridan; Joseph Bach

(57) ABSTRACT

The present invention generally provides a method for processing a semiconductor substrate, wherein the method includes positioning a substrate in a processing chamber having at least a first and second coils positioned above the substrate and supplying a first electrical current to the first coil. The method further includes supplying a second current to the second coil and regulating a current ratio of electrical current supplied to the first and second coils with a power distribution network in communication with the first and second coils and a single power supply. The method may further include controlling plasma uniformity in a semiconductor processing chamber, wherein the control process includes positioning a first coil above the processing chamber, the first coil being concentrically positioned about a vertical axis of the processing chamber, and positioning a second coil above the processing chamber, the second coil being concentrically positioned about the vertical axis of the processing chamber and radially outward from the first coil. The control process may further include supplying electrical power to the first and second coils with a single power distribution network to selectively regulate a magnetic field intensity generated by the first and second coils above a workpiece in the processing chamber.

31 Claims, 10 Drawing Sheets

U.S. PATENT DOCUMENTS

| | | | |
|---|---|---|---|
| 5,401,350 A | | 3/1995 | Patrick et al. ............... 156/345 |
| 5,556,501 A | | 9/1996 | Collins et al. ............... 156/345 |
| 5,637,961 A | * | 6/1997 | Ishii et al. ............... 315/111.21 |
| 5,731,565 A | | 3/1998 | Gates .................... 219/121.54 |
| 5,900,699 A | | 5/1999 | Samukawa et al. ...... 315/111.51 |
| 5,907,221 A | | 5/1999 | Sato et al. ............... 315/111.51 |
| 6,008,139 A | | 12/1999 | Pan et al. .................... 438/730 |
| 6,016,131 A | * | 1/2000 | Sato et al. ............... 315/111.51 |
| 6,020,686 A | | 2/2000 | Ye et al. .................. 315/111.51 |
| 6,051,504 A | | 4/2000 | Armacost et al. ........... 438/706 |
| 6,068,784 A | | 5/2000 | Collins et al. ................ 216/68 |
| 6,077,384 A | | 6/2000 | Collins et al. .............. 156/345 |
| 6,083,344 A | | 7/2000 | Hanawa et al. ............. 156/345 |
| 6,085,688 A | | 7/2000 | Lymberopoulos et al. ....................... 118/723 I |
| 6,129,807 A | | 10/2000 | Grimbergen et al. ....... 156/345 |
| 6,153,530 A | | 11/2000 | Ye et al. ..................... 438/720 |
| 6,159,860 A | | 12/2000 | Yang et al. .................. 438/706 |
| 6,221,782 B1 | | 4/2001 | Shan et al. .................. 438/710 |
| 6,247,425 B1 | | 6/2001 | Lymberopoulos et al. ....................... 118/723 I |
| 6,251,792 B1 | | 6/2001 | Collins et al. .............. 438/710 |
| 6,507,155 B1 | * | 1/2003 | Barnes et al. ........... 315/111.21 |

* cited by examiner

METHOD FOR CONTROLLING ETCH UNIFORMITY

This application is a continuation in part of copending patent application Ser. No. 09/544,377, filed Apr. 6, 2000 now U.S. Pat. No. 6,507,155.

BACKGROUND OF THE INVENTION

1. Field of the Invention

Embodiments of the invention generally relate to controlling plasma uniformity in a semiconductor process.

2. Background of the Related Art

Plasma reactors are regularly utilized in various semiconductor processes, such as etching processes, chemical vapor deposition processes, and other processes related to the manufacture of semiconductor devices. An inductively coupled RF plasma reactor typically has an inductive coil antenna wound around the reactor chamber and connected to a plasma source RF power supply. An inductively coupled RF plasma reactor facilitates generation of high plasma ion density, which is beneficial for obtaining high production throughput, while also avoiding a concomitant increase in ion bombardment damage to a substrate being processed.

Conventional inductively coupled plasma reactors have a plasma ion density distribution across the surface of the substrate being processed that varies greatly depending upon various processing parameters. These processing parameters, for example, may include the quantity and/or type of process gas or gas mixture introduced into the reactor chamber. The plasma ion density may be high at the substrate center and low at the substrate periphery for one process gas, while for another process gas the plasma ion density may be low at the substrate center and high at the substrate periphery. As a result of these types of processing characteristics, conventional plasma reactor RF coil designs are customized for each process or process gas in order to provide a specific plasma uniformity across a substrate surface in the reactor. More than one RF coil, typically two coils, have also been implemented in order to improve plasma uniformity in the processing chamber. In this configuration, the first RF coil is in electrical communication with a first power supply through, for example, a first matching network/circuit, while the second RF coil is in electrical communication with a second RF power supply through a second matching network/circuit. Therefore, the respective RF power supplies and accompanying matching networks operate to individually control the power supplied to the respective coils.

FIG. 1 illustrates a cross sectional view of a typical plasma processing chamber having two RF coils disposed on a lid of the chamber. The plasma processing chamber generally includes a vacuum chamber 10 having a generally cylindrical side wall 15 and a dome shaped ceiling 20. A gas inlet tube 25 supplies process gas, which may be chlorine for etch processing, for example, into the chamber 10. A substrate support member or substrate pedestal 30 supports a substrate, such as semiconductor substrate 35, inside the chamber 10. An RF power supply 40 is also typically connected to the pedestal 30 through a conventional RF impedance match network 45. A plasma is ignited and maintained within the chamber 10 above substrate support 30 by RF power inductively coupled from a coil antenna 50 consisting of a pair of independent (electrically separate) antenna loops or RF coils 52, 54 wound around different portions of the dome-shaped ceiling. In the embodiment shown in FIG. 1, both loops are wound around a common axis of symmetry coincident with the axis of symmetry of the dome-shaped ceiling 20 and the axis of symmetry of the substrate pedestal 30 and substrate 35. The first RF coil 52 is wound around a bottom portion of the dome-shaped ceiling 20 while the second RF coil 54 is positioned centrally over the ceiling 20. First and second RF coils 52, 54 are separately connected to respective first and second RF power sources 60, 65 through first and second RF impedance match networks 70, 75. RF power in each RF coil 52, 54 is separately controlled. The RF power signal applied to the first RF coil (bottom/outer antenna loop) 52 predominantly affects plasma ion density near the periphery of the substrate 35 while the RF power signal applied to the second RF coil (top/inner antenna loop) 54 predominantly affects plasma ion density near the center of the substrate 35. The RF power signals delivered to each of the RF coils are adjusted or configured relative to each other to achieve substantial uniformity of plasma ion distribution over a substrate disposed on a substrate support member.

In operation, the plasma processing system receives a substrate 35 on substrate support member 30 for processing in chamber 10. Chamber 10 may then be pulled to a predetermined pressure/vacuum by a vacuum pump system (not shown). Once the predetermined pressure is achieved, a process gas may be introduced into the chamber 10 by gas inlet tube 25, while the vacuum pumping system continues to pump the chamber 10, such that an equilibrium processing pressure is obtained. The processing pressure is adjustable through, for example, throttling the communication of the vacuum system to the chamber 10 or adjusting the flow rate of the process gas being introduced into chamber 10 by gas line 25. Once the pressure and gas flow are established, the respective power supplies may be activated. Thus, power is independently supplied to the inner coil 54, outer coil 52, and the substrate support member 30. The application of power to the coils 52 and 54, which is generally RF power, facilitates striking of a plasma in the region immediately above the substrate support member 30. The ion density of the plasma may be increased or decreased through adjustment of the power supplied to the coils 52 and 54 or through adjustment of the processing pressure in chamber 10, i.e., through increased/decreased flow rate of the process gas or an increase/decrease in the chamber pumping rate.

During conventional semiconductor processing methods, the ion density generally remains constant over the surface of the substrate during a substrate processing sequence. This is undesirable for some processing sequences, as the plasma uniformity over the surface of the substrate generated by a particular processing chamber may be acceptable for one portion of a sequence, while causing substrate damage during another portion of the sequence. Conventional processing chambers may vary the ion density and uniformity by varying pressure in the chamber (the density or flow of the process gas into the chamber) or the power applied to the coils. However, varying the gas flow and/or power applied to the coils is also undesirable, as varying these parameters affects also affects the plasma composition, which is desired to remain constant through a processing sequence.

Another disadvantage of conventional processing systems is that the addition of an independent RF power source and associated RF impedance match network for each RF coil increases the equipment and operation costs for each additional RF coil utilized on a processing chamber. This directly results in an increased cost for processing substrates. Furthermore, the independent RF source and matching network configuration presents difficulties in matching the impedance of the respective coils, which leads to more difficulties in controlling the plasma power delivered to each of the coils.

Other conventional apparatuses have attempted to control plasma power in an inductively coupled plasma reactor having multiple coils utilizing a plurality of high power relays for switching connection from the power source to each of the coils. However, these switching mechanisms do not provide efficient operation of the coils, do not provide sufficient control of the power delivered to each of the coils on a continual basis, and have been difficult to build.

Therefore, in view of the disadvantages of conventional systems, there is a need for an improved apparatus and method for controlling plasma uniformity, wherein the apparatus and method allows for plasma uniformity adjustment without adjusting conventional processing parameters.

SUMMARY OF THE INVENTION

Embodiments of the invention generally provide a method for processing a semiconductor substrate, wherein the method includes positioning a substrate in a processing chamber having at least a first and second coils positioned above the substrate and supplying a first electrical current to the first coil. The method further includes supplying a second current to the second coil and regulating a current ratio of electrical current supplied to the first and second coils with a power distribution network in communication with the first and second coils and a single power supply.

Embodiments of the invention further provide a method for controlling plasma uniformity in a semiconductor processing chamber, wherein the method includes positioning a first coil above the processing chamber, the first coil being concentrically positioned about a vertical axis of the processing chamber, and positioning a second coil above the processing chamber, the second coil being concentrically positioned about the vertical axis of the processing chamber and radially outward from the first coil. The method further includes supplying electrical power to the first and second coils with a single power distribution network to selectively regulate a magnetic field intensity generated by the first and second coils above a workpiece in the processing chamber.

Embodiments of the invention further provide a method for varying plasma uniformity in a semiconductor processing chamber having at least a first and second coils positioned above the chamber. The method generally includes supplying a first electrical current to the first coil, supplying a second electrical current to the second coil, and varying a capacitive element in a power distribution network to control a ratio of the first electrical current to the second electrical current.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
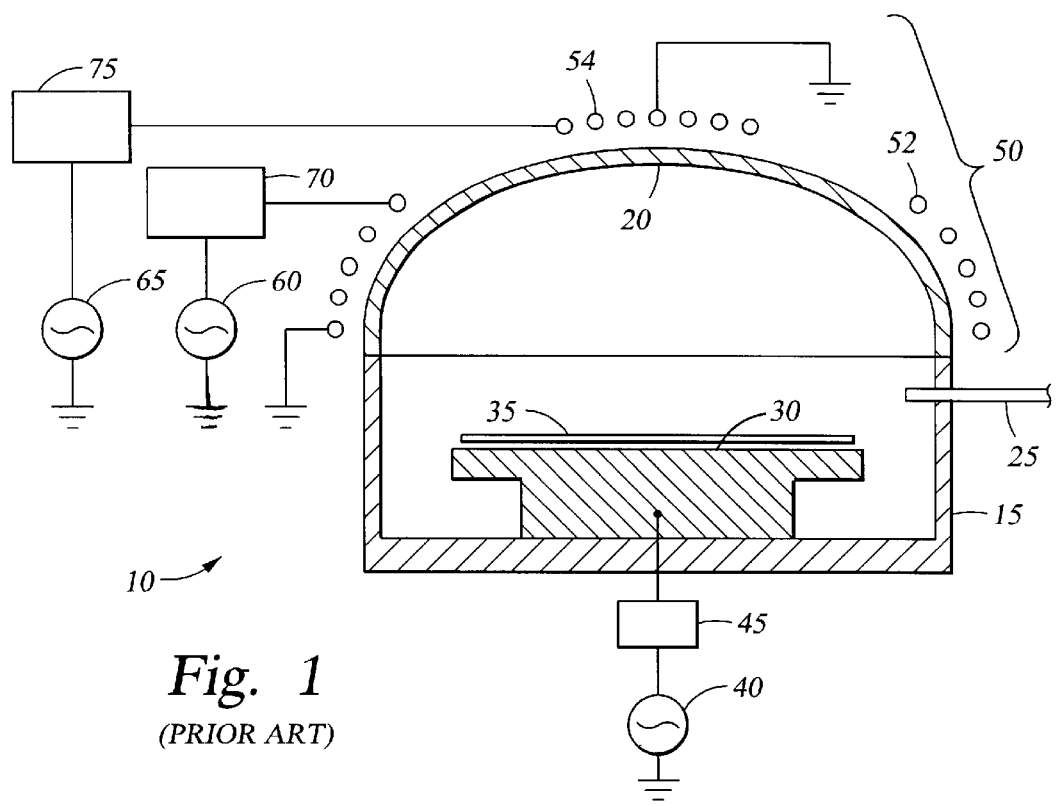
FIG. 1 illustrates a cross sectional view of a conventional plasma processing chamber having two RF coils disposed on a lid of the chamber.
Figure 2:
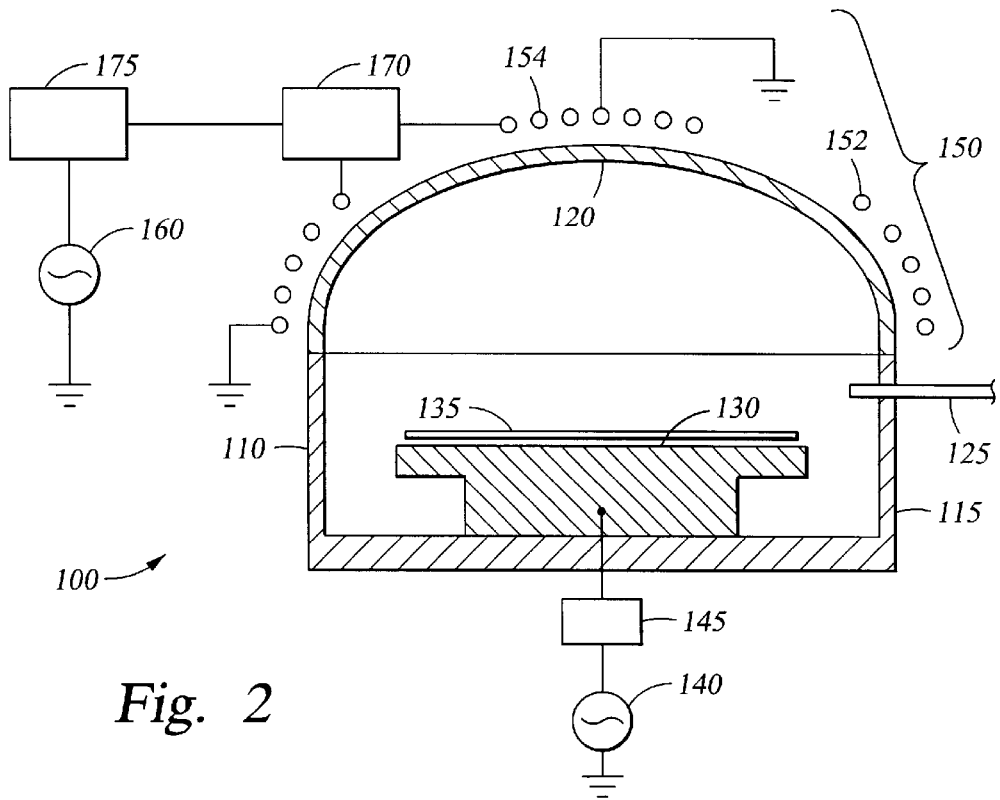
FIG. 2 illustrates a cross sectional view of an exemplary plasma processing chamber of the invention.

FIG. 2 is a cross sectional view of a plasma processing chamber of the invention. The plasma processing chamber 100 generally includes a vacuum chamber 110 having a generally cylindrical side wall 115 and a dome-shaped lid 120. A gas inlet 125 supplies one or more process gases to chamber 110. A substrate support member 130 supports a substrate, such as semiconductor substrate 135, for example, inside the chamber 110. An RF power supply 140 may be connected to the substrate support member 130 through a conventional RF impedance match network 145. A plasma is ignited and maintained within the chamber 100 through application of RF power to a coil antenna 150. The coil antenna 150 may include a plurality of RF coils 152, 154 wound around the dome shaped lid 120. Coils 152, 154 may be concentrically wound around a vertical axis that extends through the center of chamber 100 or lid 120 and may be inductively coupled to a single RF power supply 160. In the embodiment shown in FIG. 2, two loops or coil assemblies are wound around a common axis of symmetry coincident with the axis of symmetry of the dome-shaped lid 120 and the axis of symmetry of the substrate support member 130. The first RF coil 152 is wound around a bottom or lower portion of the dome-shaped lid 120 proximate the outer edge of the substrate support member 130, while the second RF coil 54 is positioned centrally above the lid 20 generally above the center of substrate support member 130. The first and second RF coils 152, 154 are connected to a single RF power source 160 through an RF power distribution network 170 of the invention. Optionally, an RF impedance match network 175 may be connected between the RF power source 160 and the RF power distribution network 170.

RF power delivered to each RF coil 152, 154 is controlled by the RF power distribution network 170. The RF power signal applied to the first RF coil 152 (i.e., bottom/outer antenna loop positioned proximate the periphery of the substrate support member 130) predominantly affects plasma ion density near the periphery or outer circumference portion of a substrate 135 positioned on substrate support member 130. The RF power applied to the second RF coil 154 (i.e., top/inner antenna loop positioned generally above the center of the substrate support member 130) predominantly affects plasma ion density near the center of the substrate 135 positioned on substrate support member 130. The RF power signals delivered to each of the RF coils 152, 154 may be adjusted relative to each other in order to achieve a substantially uniform plasma ion distribution/density across the surface of the substrate 135 positioned on a substrate support member 130. The power distribution network 170 may also be adjusted to produce varied levels of plasma ion density across the surface of the substrate 135. Therefore, selective application of RF power to coils 152, 154 operates to both generate a more uniform plasma ion density across the surface of the substrate, if desired, or alternatively, the selective application of RF power may be used to generate a particular plasma ion density calculated to generate a desired level of non-uniformity in the plasma. The variance of the plasma ion density generally results from the varied magnetic field generated by the respective coils when the RF power applied thereto is varied, as the power supplied to a coil is known to be proportional to the magnetic field generated therefrom. Therefore, when more than on coil is implemented, the power to the respective coils may be selectively varied in order to selectively vary the magnetic field generated by the combination of coils. For example, if a greater magnetic field is desired proximate the perimeter of the substrate, then the power applied to a coil positioned proximate the perimeter of the substrate may be increased.

Figure 3A:
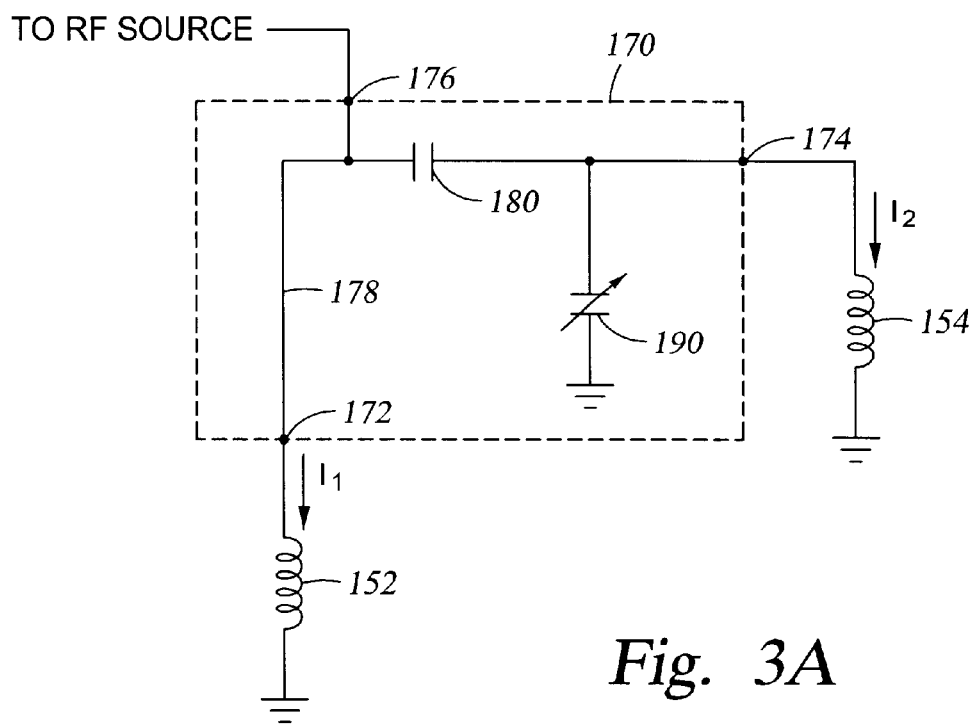
FIG. 3a illustrates an exemplary RF power distribution network of the invention.

FIG. 3A is a schematic diagram of one embodiment of an RF power distribution network 170 of the invention. The RF power distribution network 170 includes an input 176 for connecting to the RF power source 160, a first output 172 for connecting to the first RF coil 152, and a second output 174 for connecting to the second RF coil 154. As shown in FIG. 3*a*, the RF power distribution network 170 includes a bypass line 178 connecting the input 176 to the first output 172, a series capacitor 180 connected between the input 176 and the second output 174, and a shunt capacitor 190 connected between the second output 174 and a ground connection. Both of the RF coils 152, 154 also include a ground connection. Effectively, in electrical terms, the shunt capacitor 190 is connected in parallel with the second RF coil 154, and the series capacitor 180 is connected in series with the parallel combination of the shunt capacitor 190 and the second RF coil 154. This series/parallel combination of elements is connected in parallel with the first RF coil 152 to the RF power source, preferably through an RF impedance match network 175.

Figure 3B:
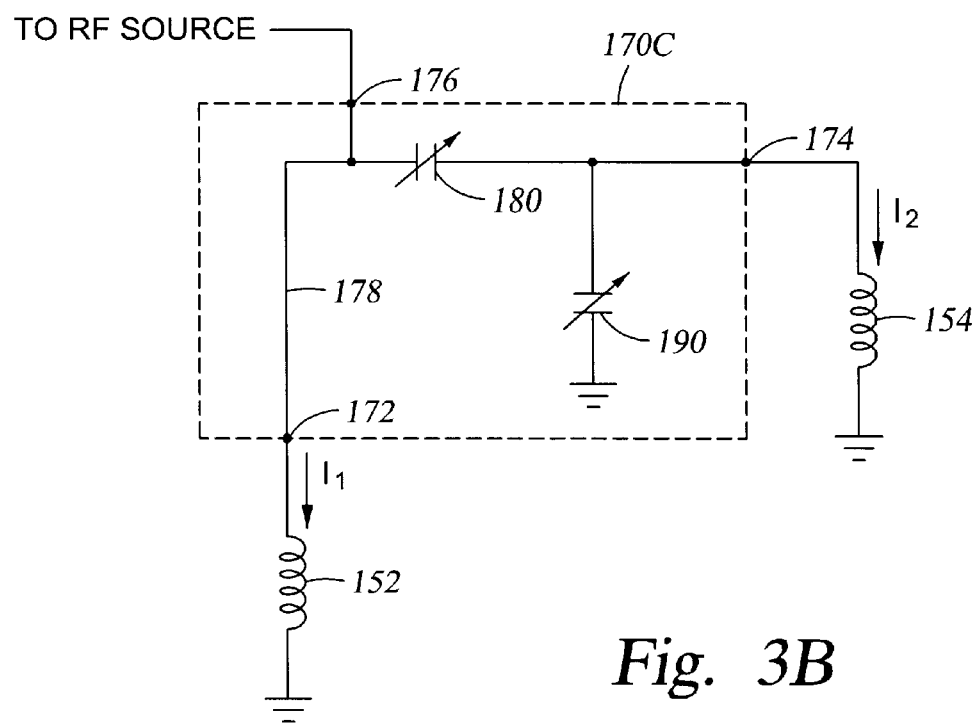
FIG. 3b illustrates another exemplary RF power distribution network of the invention.

The series capacitor 180 and the shunt capacitor 190 may comprise one or more variable capacitors that may be regulated by a controller configured to vary or change the capacitance of the capacitor. Either or both of the capacitors 180, 190 can be variable capacitors. In one preferred embodiment, the series capacitor 180 comprises a capacitor having a fixed capacitance value, while the shunt capacitor 190 comprises a variable capacitor. FIG. 3*b* is a schematic diagram of an alternative embodiment of the RF power distribution network 170*c*. The components shown in FIG. 3*b* are the same as those shown in FIG. 3*a* except for the series capacitor 180*c*, which is a variable capacitor. The RF power distribution network 170*c* as shown in FIG. 3*b* provides additional flexibility in control for the power distribution between the two coils because both series capacitance and shunt capacitance are adjustable.

Figure 4:
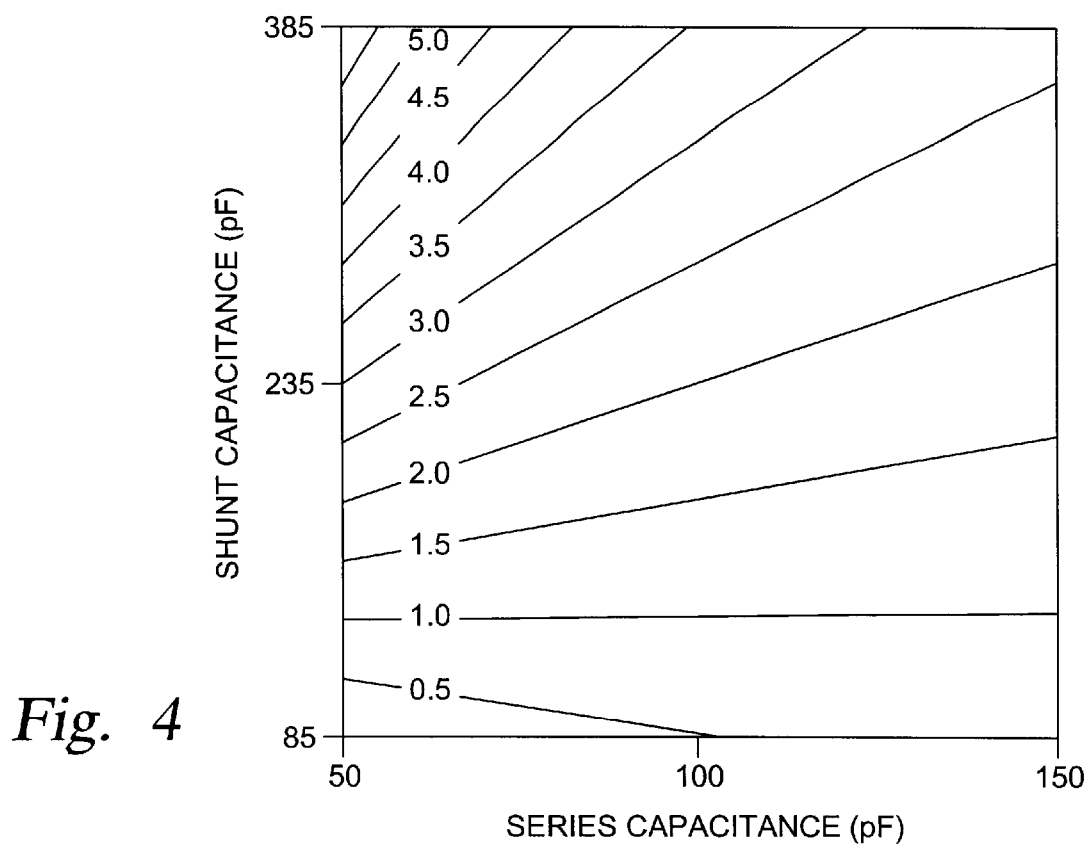
FIG. 4 illustrates the effects on the ratio of the electrical currents flowing through the two RF coils caused by varying the capacitance values of the series and shunt capacitors.

FIG. 4 is a graphical illustration showing the effects on the ratio of the electrical currents I1 and I2 flowing through the two RF coils caused by varying the capacitance values of the series and shunt capacitors. As shown, the current ratio, I1/I2, can be tuned to a desired value by adjusting the capacitance value of either the series capacitor or the shunt capacitor.

In one preferred embodiment, the shunt capacitor comprises a variable capacitor, and the power distribution between the two coils is controlled by adjusting the capacitance of the shunt capacitor 190. Typically, by varying the shunt capacitor, the ratio of I2:I1 can be adjusted from about 0.2 to about 5. Preferably, the capacitance of the shunt capacitor 190 can be varied to provide a ratio of I1:I2 between about 1:3 and about 3:1 in order to provide greater flexibility in shaping the plasma ion concentration in the chamber. For example, for the configuration shown in FIG. 3*a*, utilizing a RF power source operating at 13.56 MHz, a variable shunt capacitor 190 and a fixed series capacitor 180 of about 65 pF, the ratio of I1/I2 can be adjusted from about 0.4 to about 2.0 by the adjusting the shunt capacitor between about 100 pF and about 200 pF. As another example, in another configuration utilizing a variable series capacitor 180 and a fixed shunt capacitor 180 of about 115 pF, the ratio of I1/I2 can be adjusted from about 0.56 to about 0.85 by the adjusting the series capacitor between about 50 pF and about 150 pF.

Figure 10:
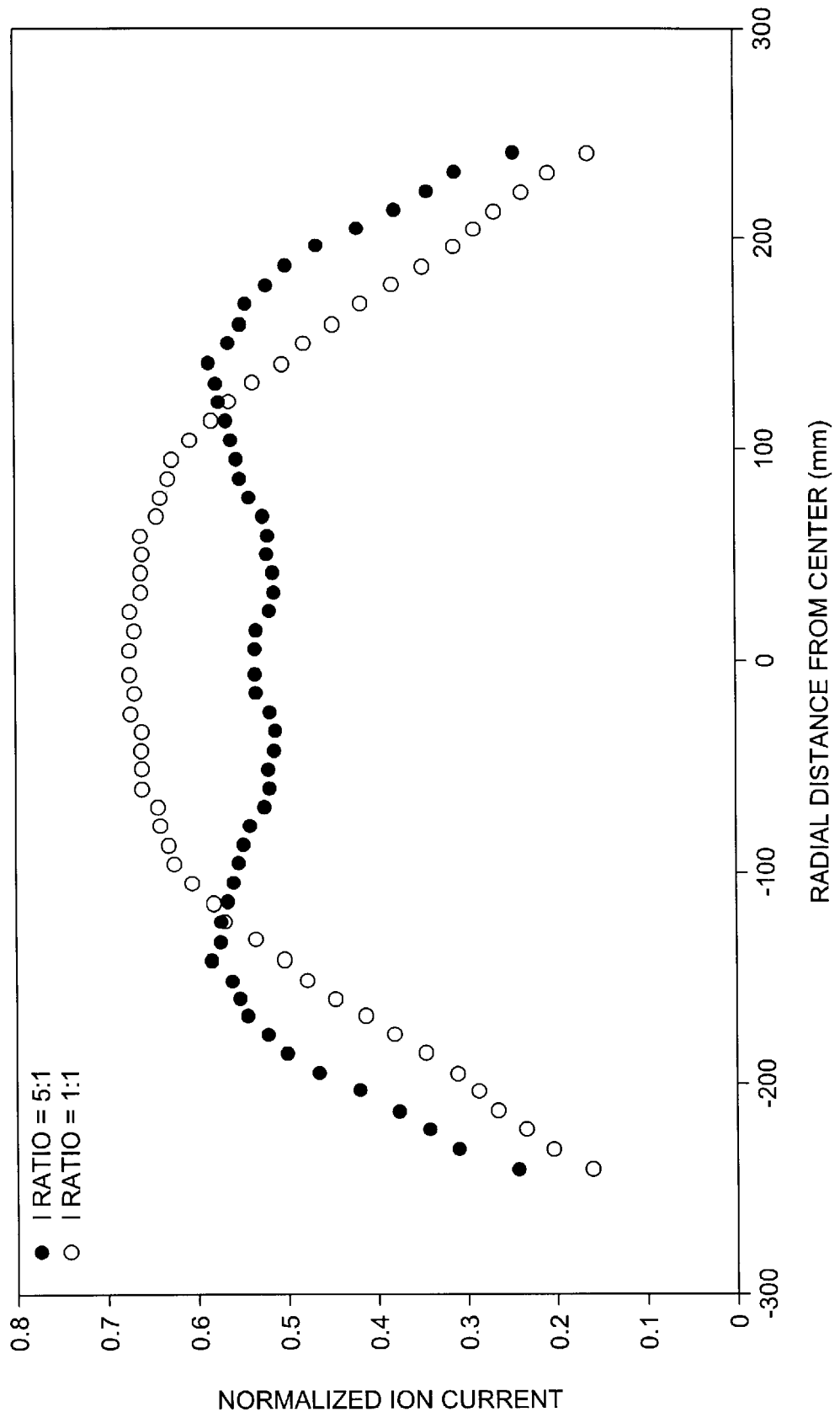
FIG. 10 illustrates a graphical representation of ion density versus radial position in a plasma processing chamber having dual helical coils.

FIG. 10 is a graphical representation of ion density versus radial position in a plasma processing chamber having dual helical coils. As shown, a current ratio I1/I2 of about 1:1 provides substantially uniform plasma ion density (about ±3%) within about 100 mm radius from a central axis through the chamber. For a current ratio I1/I2 of about 5:1, the plasma ion density is substantially uniform (about ±4%) within about 180 mm radius. The invention provides control of the plasma ion density during processing, and the current ratio can be varied during different time periods of a process recipe to accommodate other processing parameters that may affect the plasma density during the process.

The power distribution network of the invention provides active control of the RF current flowing to each of the coils utilizing reactive elements such as capacitors. Generally, the power delivered to each coil includes a real component and a reactive component, and the invention varies the reactive component of the power delivered to each coil to change the distribution of power between the two coils. The real component of the power delivered to each coil remains substantially unaffected by the power distribution network. As further advantages, the power distribution network does not degrade the efficiency of transfer of power from the power source to the coils and does not significantly change the overall impedance of the entire circuit (i.e., including the coils). The efficiency of the power transfer is generally unaffected by the power distribution network of the invention because the network comprises only capacitive elements which have negligible resistive losses. A related advantage provided by the invention is that the impedance (or load) as seen by the power source is maintained at a desired value while the current ratio is varied by the power distribution network. The adjustments to the series capacitance and shunt capacitance of the power distribution network does not substantially change the load impedance to the power source.

A further advantage of the power distribution network of the invention is the ability to maintain a common phase angle for the RF currents in the multiple source coils, even as the current ratio is varied. The ability of control a common phase relationship in the RF currents is a major factor in achieving a controllable plasma uniformity because out-of-phase RF currents in adjacent source coils causes a net canceling effect, thereby shifting the power deposition away from the plasma load. The invention provides control of the phase relationship between the currents in the coils while the current ratio is varied. Typically, the invention maintains a phase difference of less than about 10 degrees between the currents in the two coils.

Figure 5:
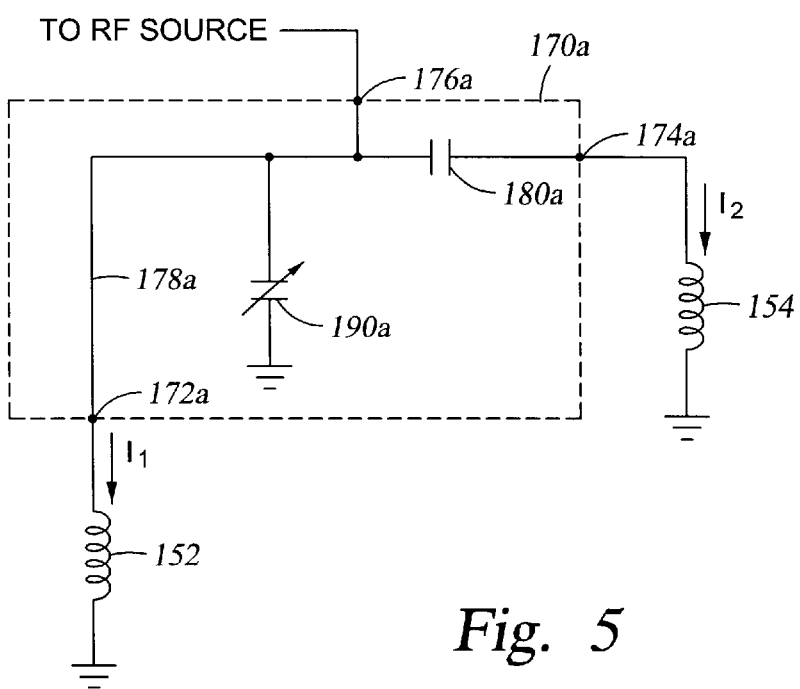
FIG. 5 illustrates an alternative embodiment of an exemplary RF power distribution network of the invention.

FIG. 5 is a schematic diagram of an alternative embodiment of an RF power distribution network of the invention. The RF power distribution network 170a includes an input 176a for connecting to the RF power source 160, a first output 172a for connecting to the first RF coil 152, and a second output 174a for connecting to the second RF coil 154. As shown in FIG. 5, the RF power distribution network 170a includes a bypass line 178a connecting the input 176a to the first output 172a, a series capacitor 180a connected between the input 176a and the second output 174a, and a shunt capacitor 190a connected between the input 176a and a ground connection. Both of the RF coils 152, 154 also include a ground connection. Effectively, in electrical terms, the shunt capacitor 190a is connected in parallel with the first RF coil 152, and the series capacitor 180a is connected in series with the second RF coil 154. Preferably, an RF impedance match network 175 is connected between the input 176a and the RF power source 160. The alternative embodiment of the RF power distribution network also provides an adjustable current ratio, I1/I2, by adjusting the capacitance value of either the series capacitor or the shunt capacitor.

Figure 6:
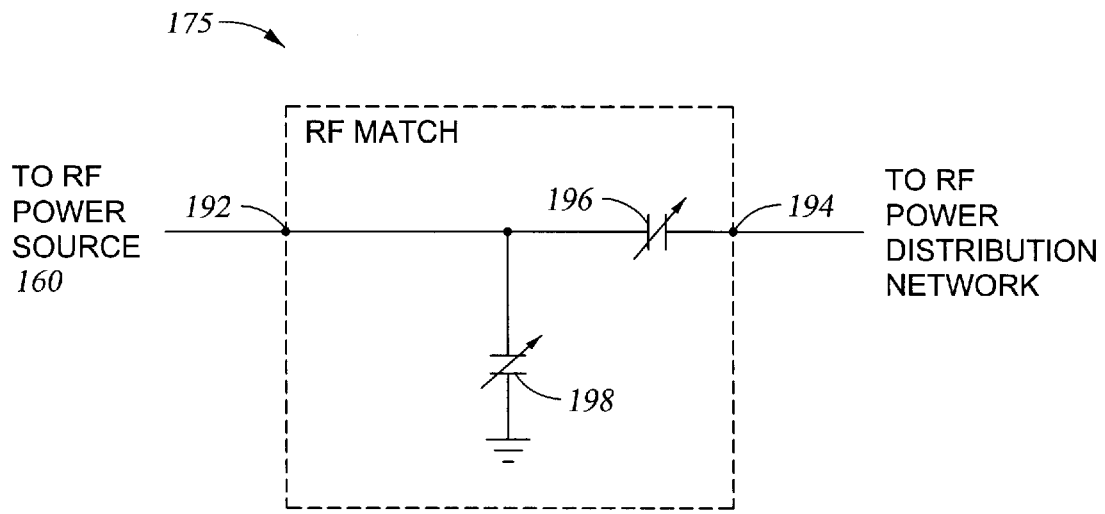
FIG. 6 illustrates an exemplary RF impedance match network.

FIG. 6 is a schematic diagram of an RF impedance match network 175. The RF impedance match network 175 includes an input 192 connected to the RF power source 160 and an output 194 connected to the input 176 or 176a of the RF power distribution network 170 or 170a. The RF impedance match network 175 includes a series capacitor 196 connected between the input 192 and the output 194, and a shunt capacitor 198 connected between the input 194 and a ground connection. The series and shunt capacitors 196, 198 preferably are variable capacitors. Alternatively, either or both of the series and shunt capacitors 196, 198 may be variable capacitors. The RF impedance match network 175 can be adjusted to provide efficient or optimized power transfer from the RF power source 160 to the RF coils 170, 175.

Figure 7:
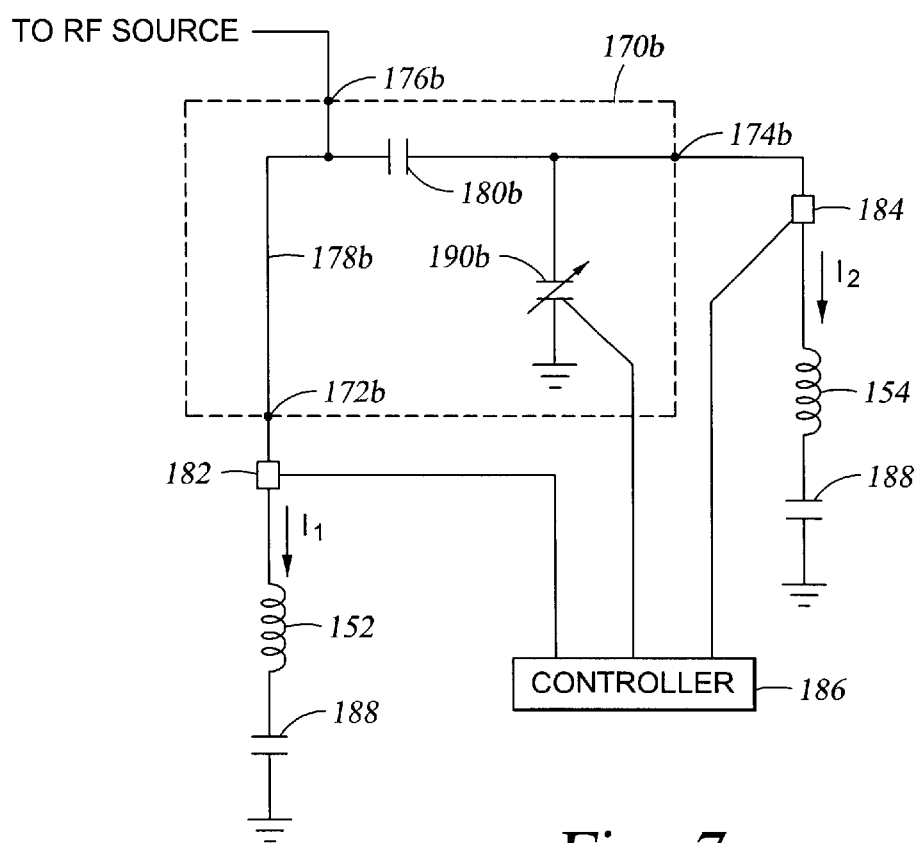
FIG. 7 illustrates another exemplary embodiment of an RF power distribution network of the invention.

FIG. 7 is a schematic diagram of another embodiment of an RF power distribution network of the invention. The RF power distribution network 170b includes an input 176b for connecting to the RF power source 160, a first output 172b for connecting to the first RF coil 152, and a second output 174b for connecting to the second RF coil 154. The RF power distribution network 170b includes a bypass line 178b connecting the input 176b to the first output 172b, a series capacitor 180b connected between the input 176b and the second output 174b, and a shunt capacitor 190b connected between the second output 174b and a ground connection. Each of the RF coils 152, 154 is preferably connected to a ground connection through an optional grounding capacitor 188. For the embodiment shown in FIG. 7, the series capacitor 180b comprises a fixed capacitor, and the shunt capacitor 190b comprises a variable capacitor. A first current sensor 182 is disposed inline with the first RF coil 152, and a second current sensor 184 is disposed inline with the second RF coil 154. A controller 186, comprising a computer or microprocessor, is connected to the current sensors 182, 184 and the shunt capacitor 190b. The current sensors 182, 184 measure or sense the electrical current flowing to respective RF coils 152, 154 and provide the measured electrical current data to the controller 186. The controller 186 controls the capacitance of the shunt capacitor 190b in response to the data provided by the sensors 182, 184, and adjusts or changes the capacitance of the shunt capacitor 190b to maintain a desired current ratio I1/I2 which results in uniform plasma ion density.

Figure 8:
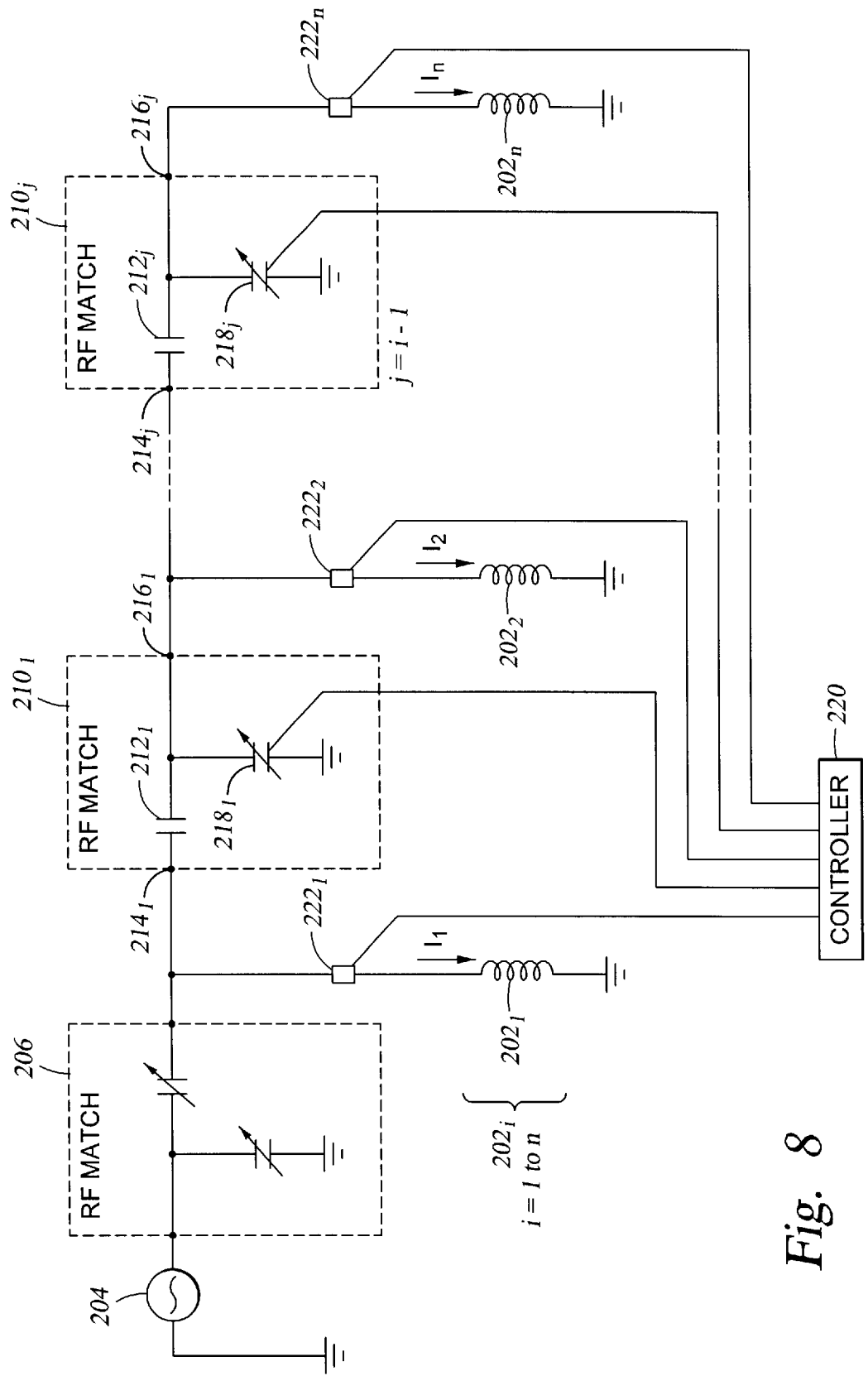
FIG. 8 illustrates another exemplary embodiment of an RF power distribution network of the invention useful for a plasma processing chamber having multiple RF coils.

FIG. 8 is a schematic diagram of another embodiment of an RF power distribution network of the invention useful for a plasma processing chamber having multiple RF coils. As shown in FIG. 8, a plurality of RF coils 202i, where i=1 to n, are connected to a single RF power source 204, preferably through an RF impedance match network 206. Each RF coil 202i includes a ground connection. A first RF coil 2021 is connected to the output of the RF impedance match network 206 without an RF power distribution network, but each subsequent RF coil 202i, where i=2 to n, includes an RF power distribution network 210j, where j=i−1. The second RF coil 2022 is connected to an RF power distribution network 2101, and this combination is connected in piggyback fashion with the first RF coil. Similarly, each subsequent combination of RF coil 202i and RF power distribution network 210j is connected in piggy-back fashion with the previous RF coil 202i−1, resulting in one RF power distribution network connected between sequential branches of RF coils. Each RF power distribution network 210j comprises a series capacitor 212j connected between an input 214j and an output 216j of the RF power distribution network, and a shunt capacitor 218j connected between the output 216j and a ground connection. Alternatively, the shunt capacitor 218j is connected between the input 214j and a ground connection.

The series capacitor 212j and the shunt capacitor 218j may comprise one or more variable capacitors which can be controlled by a controller 220 for varying or changing the capacitance of the capacitor. Either or both of the capacitors 212j, 218j can be variable capacitors. Preferably, the series capacitor 212j comprises a capacitor having a fixed capacitance value while the shunt capacitor 218j comprises a variable capacitor. Electrical current flowing through each RF coil can be tuned to a desired value by adjusting the capacitance value of the variable capacitor (i.e., either series or shunt capacitor) associated with the RF coil. Optionally, a plurality of sensors 222i may be positioned inline with each RF coil to measure or sense the electrical current flowing through RF coils. The sensors 222i are connected to provide electrical current data to the controller 220, which adjusts the capacitance of the variable capacitors in response data provided and maintains desired plasma ion uniformity in the chamber.

Figure 9A:
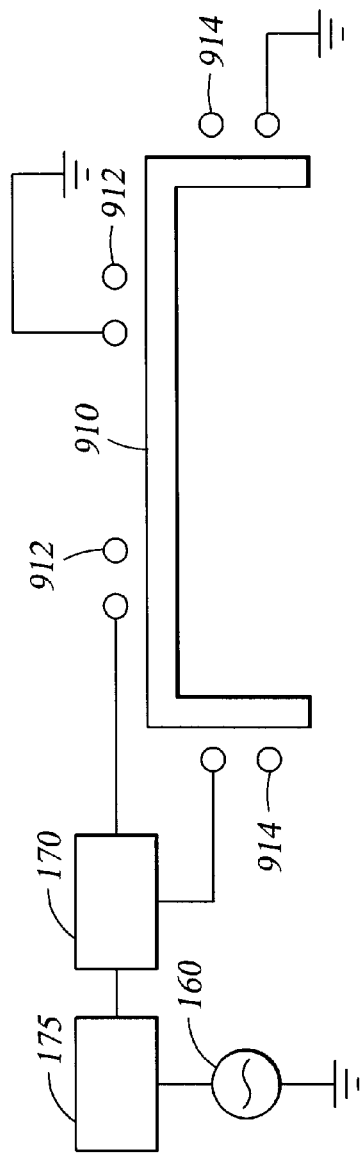
FIGS. 9a–9e illustrate various chamber designs utilizing multiple RF coils.
Figure 9B:
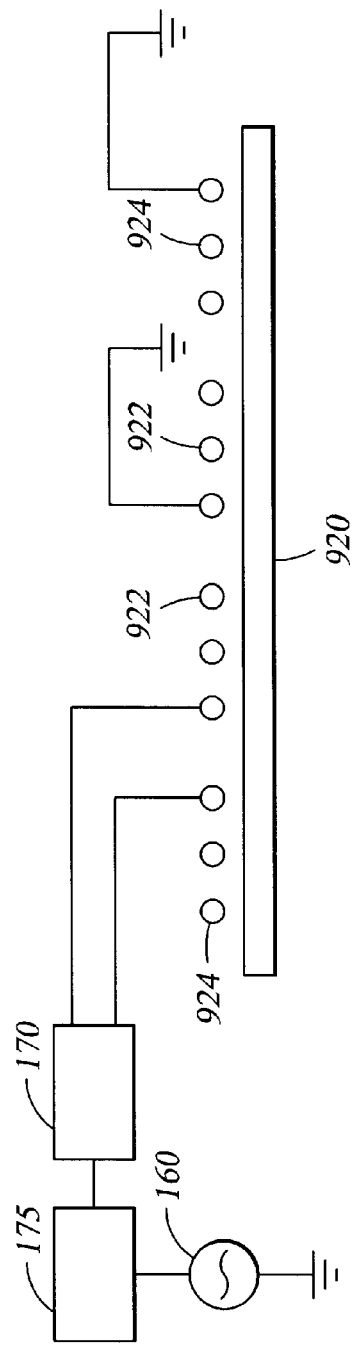
Figure 9C:
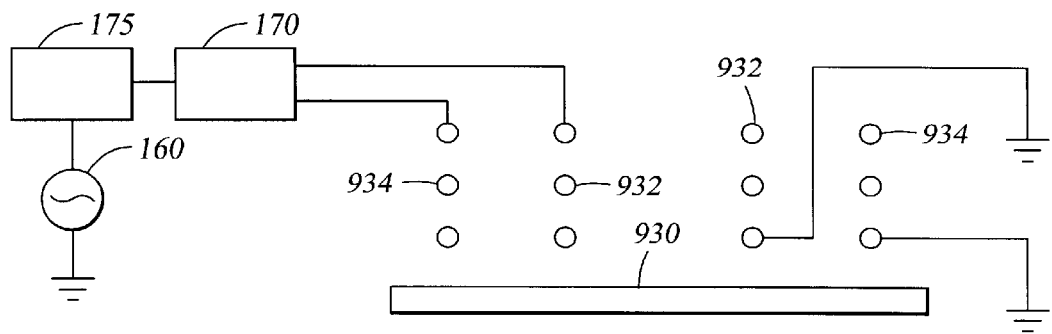
Figure 9D:
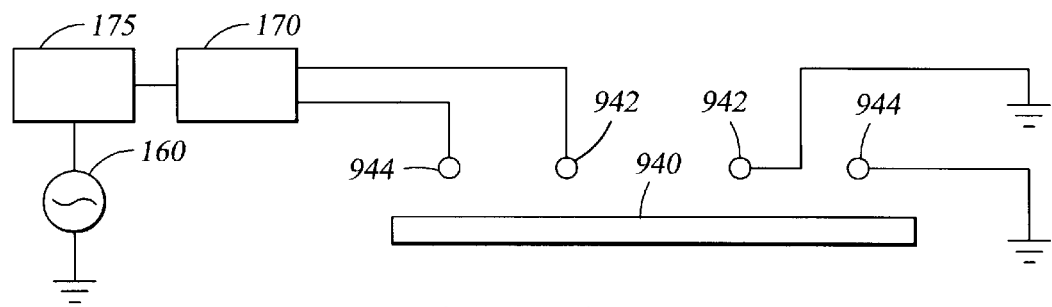
Figure 9E:
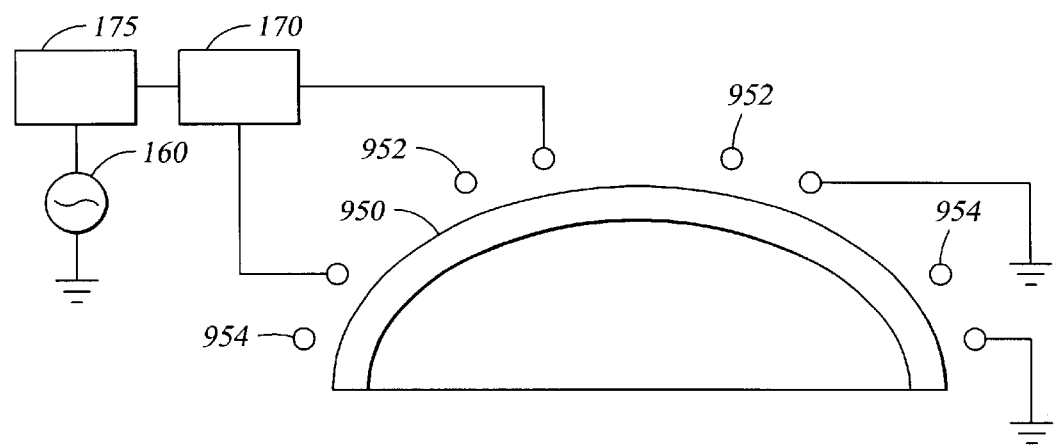

Although the invention is described using a process chamber having a domed-shaped lid with a side coil and a top coil, it is understood that the invention is applicable to other designs of process chambers having a plurality of RF coils or antenna loops that may be used in a variety of substrate manufacturing processes, including etch processes, deposition processes, and other plasma related processes. FIGS. 9a–9e illustrate cross sectional diagrams of various chamber designs utilizing multiple RF coils connected to a power source 160 through a power distribution network 170 and an optional impedance match network 175. The chamber designs shown in FIGS. 9a–9e serve as examples of chambers contemplated by the present invention and do not limit application of the present invention to other chamber designs. FIG. 9a is a schematic cross sectional view of a high density plasma (HDP) processing chamber lid 910 having a planar top coil 912 and a helical side coil 914. FIG. 9b is a schematic cross sectional view of a chamber lid 920 having concentric planar inner coil 922 and outer coil 924. FIG. 9c is a schematic cross sectional view of a dual helical coil plasma source having an inner helix 932 and an outer helix 934 disposed concentrically on a planar processing chamber lid 930. FIG. 9d is a schematic cross sectional view of a dual coil plasma source having concentric planar single turn inner coil 942 and outer coil 944 disposed on a processing chamber lid 940. FIG. 9e is a schematic cross sectional view of a dual coil plasma source disposed on a domed-shaped processing chamber lid 950. The dual coil plasma source includes non-planar top/inner coil 952 and side/outer coil 954 which conform to the non-planar shape of the dome lid. In another embodiment of the invention, a plurality of coils may be positioned above a top portion of a plasma processing chamber. Each of the plurality of coils may be wound in a generally horizontal manner, i.e., in a similar manner to a stove resistive heating ]]coil, such that the coil occupies a surface area over the top of the chamber. Additionally, each of the plurality of coils may be positioned about the top portion of the chamber to generally cover the area over the top portion of the chamber.

Figure 11:
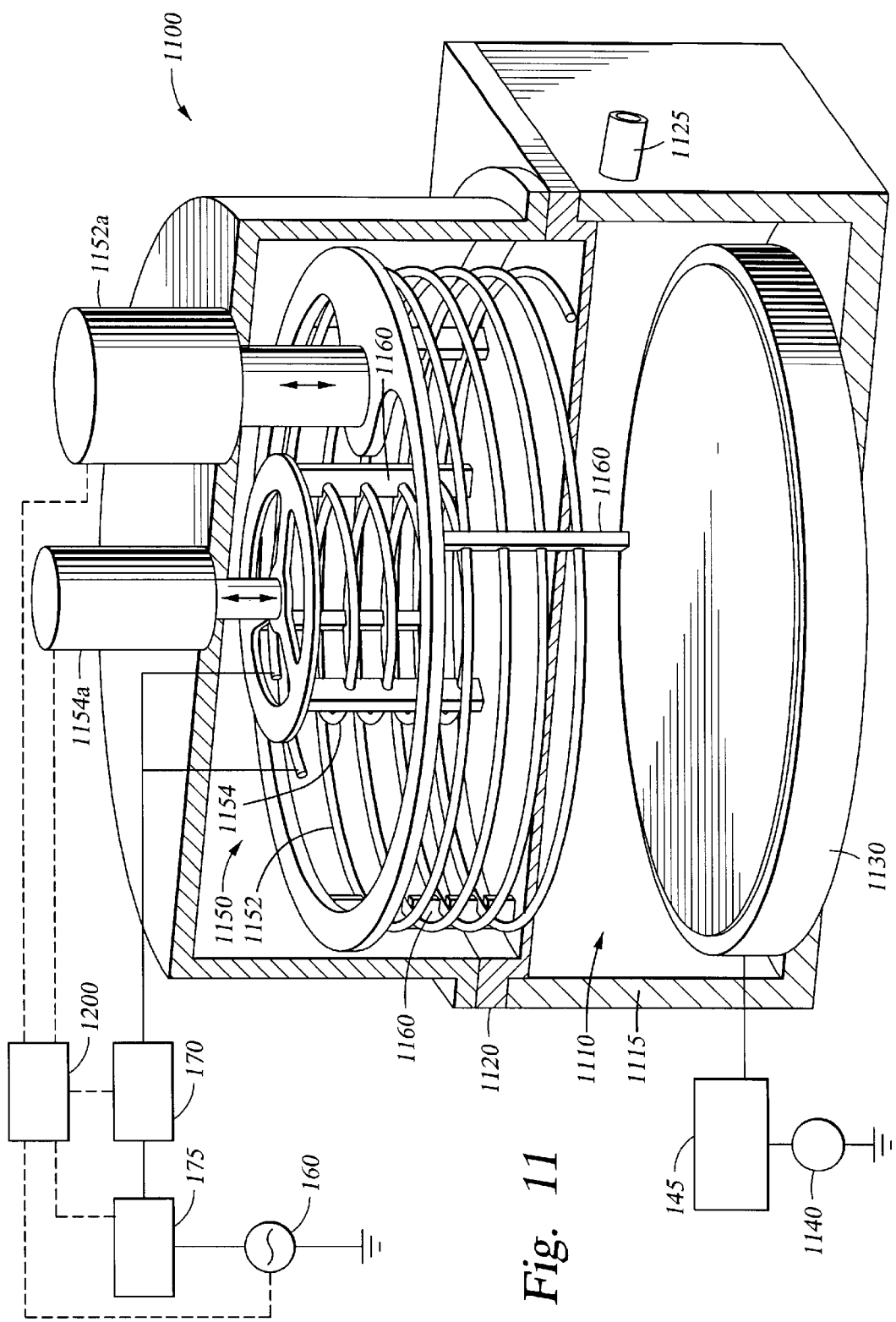
FIG. 11 illustrates a sectional view of an exemplary processing chamber of the invention incorporating movable coils.

In another embodiment of the invention, which is illustrated in FIG. 11, plasma ion density at the surface of a substrate in a processing chamber may be varied independent of the processing parameters, i.e., independent of the chamber pressure, the process gas flow rate, the power applied to the substrate support member, and the power applied to one or more coils concentrically positioned above the substrate. Additionally, the plasma ion density at the surface of the substrate may be varied without varying a current ratio to coils positioned above the processing chamber. The plasma processing system 1100 includes a processing chamber 1110 having generally cylindrical side walls 1115 surrounding a concentrically positioned substrate support member 1130. A lid assembly 1120, which may be dome or cylindrically shaped, for example, is positioned above the processing chamber 1110. A process gas inlet 1125 supplies one or more process gases to chamber 1110. An RF power supply 1140 may be connected to the substrate support member 1130 through a conventional RF impedance match network 145. A plasma is ignited and maintained within the chamber 100 through application of RF power to a coil antenna 1150, which may be through a matching network 1175 and/or a power distribution network 1170.

The coil antenna 1150 may include two RF coils 1152, 1154. Coils 1152 and 1154 are mounted on vertical support members 1160 that may be selectively moved in a vertical direction. Generally, vertical support members include a first group of support members configured to support the inner coil 1154, and a separate second group of vertical support members configured to support the outer coil 1152. Therefore, through selective vertical movement of the first group of support members or the second group of support members, coils 1152 and 1154 may be individually adjusted in a vertical direction, i.e., the vertical distance from the top of the substrate support member 1130 to each of the respective coils may be selectively increased or decreased. The actuation for the vertical adjustment of the respective coils may be provided by stepping motors or other devices configured to support precise movements in a semiconductor processing system. In this embodiment, the inner coil 1154 generally controls the plasma ion density proximate the center of the substrate support member 1130, while the outer coil 1152 generally controls the plasma ion density proximate the outer perimeter of the substrate support member 1130. This control over the plasma ion density by the respective coils is generally proportional to the magnetic field strength or intensity generated by the respective coils proximate the substrate support member 1130. Therefore, since field strength of a coil is known to decrease as the distance from the coil increases, the distance from the respective coils 1152 and 1154 may be increased or decreased in order to vary the magnetic field strength immediately above the substrate support member 1130. For example, if a process in chamber 1100 requires a center high plasma uniformity, then the inner coil 1154 may be vertically positioned closer to the substrate support member 1130 than the outer coil 1152, which operates to generate a stronger magnetic field near the center of the substrate support member. Conversely, if a center low plasma uniformity is desired, the inner coil may be positioned at a greater distance from the substrate support member 1130 than the outer coil, which operates to generate a greater magnetic field near the outer periphery of the substrate support member 1130 than that which is generated near the center by the inner coil 1154. Therefore, coils 1152 and 1154 may be selectively positioned in order to generate a desired plasma uniformity at various times during a processing sequence. This includes adjustment of the plasma uniformity during processing steps, i.e., during a recipe step of a semiconductor processing recipe.

In operation, embodiments of the invention generally provide a plasma-based semiconductor processing sequence, wherein the plasma uniformity or flux of ions and neutrals at the surface of a substrate may be varied at any time during the processing sequence. Therefore, embodiments of the invention allow for an infinite number of variations in plasma and/or etch uniformity within a processing sequence, and within recipe steps of the processing sequence, and do not require any disassembly or reconfiguration of the coil assemblies of the system in order to accomplish plasma uniformity variation. Embodiments of the invention generally provide for varying the plasma/etch uniformity through varying the magnetic field strength over selected portions of a substrate being processed, as plasma/etch uniformity and/or plasma ion density is known to be directly affected by the magnetic field strength in the plasma region of the chamber. The selected portions over the substrate generally correspond to radial bands that are concentric about the axis of the substrate being processed, i.e., annular bands that may include a circle at the center of the substrate. The magnetic field strength over these annular bands is conventionally generated by energizing one or more coils positioned over the substrate being processed. The magnetic field generated by the energized coils positioned above the substrate penetrates the chamber and directly affects plasma uniformity.

As discussed above, embodiments of the present invention may include a plurality of coils positioned above the substrate being processed. The plurality of coils may be concentrically positioned above the substrate, but are not required to be concentrically positioned for effective operation. Therefore, the magnetic field intensity immediately the substrate may be varied by varying the magnetic field output of the coils, which varies the flux of ions and neutrals in the plasma. The magnetic field output of the coils may be varied by changing the electrical current supplied to the coils. If two coils are used, the total current to the coils may be maintained constant, while the ratio of the current supplied to the respective coils may be varied in order to generate differing magnetic field strengths over different areas on the surface of the substrate. The variance in magnetic field of the respective coils and the plasma uniformity generated therefrom may be controlled by an automated controller, such as a microprocessor controller, for example, or a manually actuated control. The controller may be configured to vary the plasma uniformity at the transition between recipe steps in a semiconductor processing recipe, at one or more times within individual recipe steps of a semiconductor processing recipe, or at any other time that may be desired to facilitate semiconductor processing. Another method for varying the flux of ions and neutrals at the surface of the substrate is to increase or decrease the magnetic field strength at the substrate surface by adjusting the distance from the substrate to the plurality of coils. Since magnetic field strength is proportional to the distance from the coil, increasing the separation distance from the substrate to the coils operates to decrease the magnetic field strength exerted by the coil on the substrate. Therefore, the flux of ions and neutrals across portions of the substrate may be varied through adjustment of the separation distance of the plurality of coils positioned above the substrate.

One advantage provided by embodiments of the invention is that the plasma/etch uniformity may be varied without alteration of general processing parameters, such as chamber pressure, process gas flow, and power applied to either the substrate support member or the coils positioned above the substrate. Adjustment of the plasma/etch uniformity without varying other processing parameters allows for constant chamber conditions while plasma uniformity varies, and therefore, allows for greater stability and consistency in processing recipes. Further, variance of the plasma/etch uniformity independent of processing parameters allows single recipe steps to include multiple stages of plasma/etch uniformity without changing the overall characteristics of the plasma for the process. For example, during an etch process using an embodiment of the invention, the etching process for the etch break through, main etch, and soft-landing stages of the etch process may be undertaken using a first plasma uniformity, and then etch process may be completed using a second plasma uniformity for the final/completion over-etch stage. The variance in plasma uniformity during the etch process stages allows for optimal physical film characteristics and process throughput to be obtained. The ability to vary the plasma uniformity also allows for greater control over film damage. For example, in an aluminum etch process, as the material etches the physical characteristics of the metal are known to change, and therefore, the characteristics of the plasma etch may also be changed in order to minimize damage as the aluminum changes.

Figure 12:
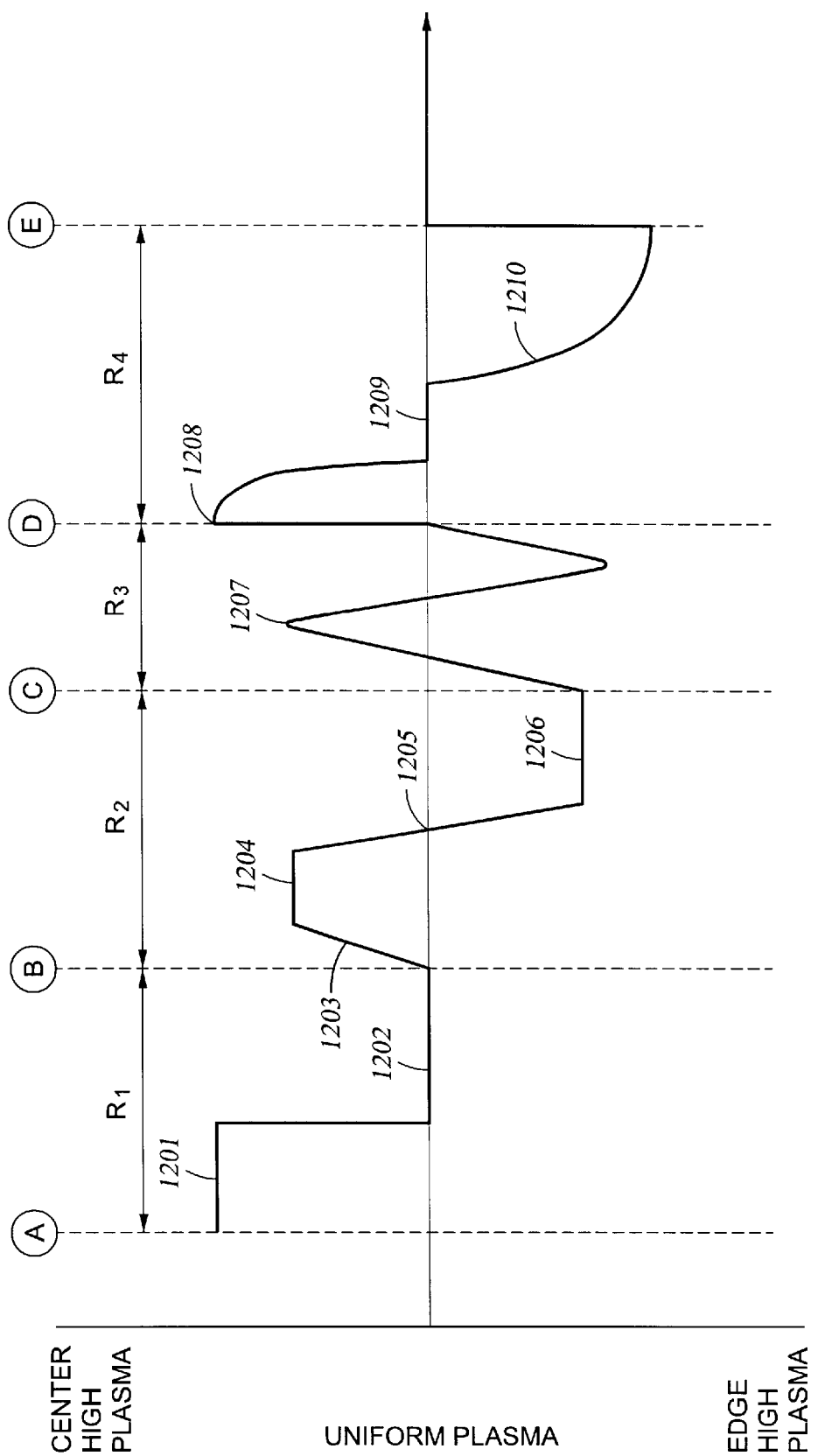
FIG. 12 illustrates a processing recipe using an exemplary method for varying the plasma uniformity of the invention.

An exemplary processing recipe utilizing a method for varying plasma uniformity of the invention is illustrated in FIG. 12. The vertical axis in FIG. 12 represents plasma uniformity (the origin is defined as a uniform plasma, the upper axis is defined as a center high plasma uniformity condition, and the lower axis is defined as an edge high plasma uniformity condition) and the horizontal axis represents processing time. The processing recipe of the exemplary method may be executed on a plasma processing chamber, such as the exemplary chamber illustrated in FIG. 2, for example. Although a processing recipe may include any number of recipe steps, the exemplary processing recipe includes four exemplary recipe steps, $R_1$, $R_2$, $R_3$, and $R_4$, that cooperatively define the processing recipe. The processing recipe, which may be an etch processing recipe, for example, begins with recipe step $R_1$ at point "A" and continues through to recipe step $R_4$ at point "E". Therefore, for example, recipe step $R_1$ may correspond to an etch break through process, recipe step $R_2$ may correspond to a main etch process, recipe step $R_3$ may correspond to soft landing etch process, and recipe step $R_4$ may correspond to an over etch process.

Regardless of the process application, the exemplary method begins with recipe step $R_1$, where the plasma/etch uniformity is initially center high, as shown by the horizontal line 1201 in the beginning portion of recipe step $R_1$. The center high condition 1201 may be generated by applying a greater current to a coil positioned over the center portion of the substrate than a coil positioned over an outer perimeter portion of the substrate, as shown in FIG. 2, which operates to generate a greater magnetic field near the center of the substrate. The supply of current to the respective coils is generally termed the current ratio and is defined as the ratio of the current in the outer coil to the current in the inner coil. Therefore, the center high plasma condition illustrated in recipe step $R_1$ at 1201 may be generated by a low current ratio, such as 1:3–5, for example. At some point in time within recipe step $R_1$ after the center high plasma is established, the plasma uniformity is changed from the center high plasma to a generally uniform plasma condition, as indicated by the horizontal line 1202. The change from the center high plasma condition to the uniform plasma condition may be accomplished by balancing the current ratio between the respective coils so that the magnetic field generated therefrom is generally equal across the surface of the substrate. Therefore, the current ratio may be 1:1, for example, during portion 1202 of recipe step $R_1$, which continues to the end of recipe step $R_1$, as indicated by "B".

The second exemplary recipe step $R_2$ begins at "B" and continues to "C". Recipe step $R_2$ begins with the plasma uniformity/etch being ramped up from the uniform plasma/etch uniformity condition of line 1202 to a predetermined center high uniformity level, as indicated by line 1203. This linear ramp up of the uniformity may be accomplished by varying the current ratio between the respective coils so that the magnetic field above the substrate linearly increases near the center of the substrate. Once the plasma/etch uniformity reaches the desired center high level, the uniformity may level off, as illustrated by line 1204. During this portion of the processing recipe step the current ratio remains constant, i.e., unchanged and not varying as with line portion 1203, and is again generally low so that a center high plasma uniformity may be generated. The plasma/etch uniformity remains center high for a period of time and then the uniformity shifts or ramps down toward an edge high plasma, as illustrated by line portion 1205. During the shift or ramp down process the current ratio in the coils is changed from a low ratio calculated to generate the center high plasma uniformity to a high current ratio calculated to generate an edge high plasma/etch uniformity, i.e., from 1:3–5 to 3–5:1. Once the plasma/etch uniformity reaches the predetermined edge high uniformity level the current ratio remains constant and the uniformity levels off, as illustrated by line 1206. This edge high plasma/etch uniformity condition may continue to point "C", which is the end of recipe step $R_2$.

Recipe step $R_3$ begins with the edge high plasma/etch uniformity 1206 of the end of recipe step $R_2$ and continues through an oscillatory process illustrated by line 1207. The oscillatory process of recipe step $R_3$ may vary the plasma/etch uniformity between an edge high uniformity and a center high uniformity in a pattern that resembles a sinusoidal wave. The variance of the plasma/etch uniformity in the sinusoidal pattern may be obtained by time varying the current ratio applied to the coils in order to produce the desired plasma/etch uniformity across the surface of the substrate. Therefore, for example, during the initial upward sloping portion of line 1207 that begins recipe step $R_3$, the current ratio may be adjusted from a high ratio calculated to generate the edge high plasma, e.g., 4 or 5:1, to a low ratio calculated to generate the center high plasma/etch, e.g., 1:4 or 5. Then the ratio may be gradually changed to again increase in order to continue the sinusoidal curve downward back toward an edge high plasma. The end of recipe step $R_3$, which is indicated by "D", includes a return of the plasma to a uniform condition, i.e., where the current ratio is about 1:1.

The final recipe step $R_4$ of the exemplary process begins at point "D" and continues to point "E". At the beginning of recipe step $R_4$ the plasma/etch uniformity is selected as center high, as indicated by line 1208. The uniformity gradually decreases during an initial time period of recipe step $R_4$, and then the decrease begins to accelerate toward a uniform plasma/etch condition, as shown by line 1209. The time variance of the plasma/etch uniformity may again be controller by manipulating the current ratio applied to the coils to generate the line 1208. Once the plasma/etch uniformity reaches a uniform plasma condition, the plasma/etch uniformity may be maintained at this condition for a period of time, as shown by line 1209. This period corresponds to a time period where the current ratio applied to the coils is maintained constant at approximately 1:1. Thereafter, the plasma/etch uniformity may be adjusted to a more edge heavy uniformity condition, as indicated by line 1210. Therefore, the current ratio may be increased in order to generate the edge heavy condition represented by line 1210. The edge heavy condition of line 1210 continues to point "E", where recipe step $R_4$ and the processing recipe are completed.

Therefore, FIG. 12 illustrates that the present invention provides a method for varying plasma/etch uniformity over a workpiece within a recipe step of a processing recipe. The method for varying the plasma/etch uniformity may use at least two generally concentrically positioned coils positioned above the chamber having the workpiece positioned therein. The magnetic field generated by the respective coils may then be varied through selective control over the current applied to the respective coils. The control over the current applied to the coils may be accomplished through implementation of a power distribution network and possibly a matching network, both of which are discussed above.

Embodiments of the invention further provide an automated controller for use in conjunction with the method of the invention. The automated controller, which may be a microprocessor based controller, as is known in the art, may generally be configured to store a control program thereon, execute the control program, receive program inputs, and provide control signals to hardware elements of a processing system. Therefore, the controller may be configured to store a predetermined processing recipe and execute a program that provides control signals to hardware components of the processing system capable of varying parameters such as the current ratio applied to coils. The controller may be configured to interface with a matching network or a power distribution network in order to vary the current supplied to at least one coil positioned above a processing system. The controller may further be configured to vary the current supplied to the coils, i.e., the current ratio, in a linear manner, a non-linear manner, a curvilinear manner, or other time varying manner. Alternatively, the controller may be a manually actuated control configured to adjust a parameter of the power distribution network or the matching network.

In another embodiment of the invention, the plasma uniformity may be varied by physically moving the respective coils farther away from the workpiece. In this embodiment the current supplied to the coils may remain constant, if desired, but the separation distance between the workpiece and the respective coils may be increased in order to decrease the magnetic field strength generated by the coil at the workpiece. Similarly, if the field strength is to be increased, then the respective coil may be moved closer to the workpiece. Therefore, for example, assuming a two coil type processing system as illustrated in FIG. 2, if a center high plasma uniformity is desired, then the coil positioned over the central portion of the chamber, i.e., the inner coil, may be moved closer to the workpiece, which increases the magnetic field intensity generated by the inner coil over the central portion of the workpiece. Similarly, if the edge high plasma is desired, then the outer coil may be moved closer to the workpiece. If a uniform plasma is desired, then the coils may be positioned approximately equidistant from the workpiece. Therefore, through selective vertical movement of the coils, varying plasma uniformity may be generated. This movement may be controlled by a microprocessor based control system, for example, or a manually actuated control. However, in similar fashion to previous embodiments, the adjustment to plasma uniformity is made without adjusting any of the internal processing parameters, such as the power applied to the coils, the pressure in the processing chamber, or the gas flow into the processing chamber.

While the foregoing is directed to the preferred embodiment of the present invention, other and further embodiments of the invention may be devised without departing from the basic scope thereof, and the scope thereof is determined by the claims that follow.

What is claimed is:

1. A method for processing a semiconductor substrate, comprising:

positioning a substrate in a processing chamber having at least a first and second coils positioned above the substrate;

supplying a first electrical current to the first coil;

supplying a second current to the second coil; and regulating a current ratio of electrical current supplied to the first and second coils with a power distribution network in communication with the first and second coils and a single power supply.

2. The method of claim 1, wherein the first and second coils are concentrically positioned.

3. The method of claim 1, wherein regulating the current ratio comprises varying a capacitance value in the power distribution network, wherein the capacitance value is proportional to the current ratio.

4. The method of claim 1, wherein regulating the current ratio comprises varying a reactive component of a power delivered to the first and second coils to change a distribution of power between the first and second coils.

5. The method of claim 4, wherein varying a reactive component further comprises maintaining a real component of the power delivered to the first and second coils substantially constant.

6. The method of claim 1, wherein regulating the current ratio further comprises maintaining processing parameters constant, wherein process parameters include at least one of a total power applied to the combination of the first and second coils, a pressure in the processing chamber, and a process gas flow into the process chamber.

7. The method of claim 1, wherein positioning a substrate in a processing chamber comprises providing a substrate support member in the processing chamber, the substrate support member having an upper surface for supporting a substrate thereon and a vertical axis extending therethrough, such that the first and second coils are concentrically mounted about the vertical axis.

8. The method of claim 2, wherein varying the parameter comprises providing a controller in communication with the power distribution network, the controller being configured to control the ratio of the first electrical current to the second electrical current.

9. The method of claim 8, wherein the controller is a microprocessor based system configured to execute a program corresponding to a semiconductor processing recipe and control processing parameters in the processing chamber.

10. The method of claim 8, wherein the controller comprises a manually actuated control configured to adjust the current ratio.

11. The method of claim 1, wherein regulating the current ratio comprises changing a plasma uniformity in the processing chamber from a first uniformity value to a second uniformity value within a recipe step of a semiconductor processing recipe.

12. A method for controlling plasma uniformity in a semiconductor processing chamber, comprising:
   positioning a first coil above the processing chamber, the first coil being concentrically positioned about a vertical axis of the processing chamber;
   positioning a second coil above the processing chamber, the second coil being concentrically positioned about the vertical axis of the processing chamber and radially outward from the first coil; and
   supplying electrical power to the first and second coils with a single power distribution network to selectively regulate a magnetic field intensity generated by the first and second coils above a workpiece in the processing chamber.

13. The method of claim 12, wherein supplying electrical power comprises:
   providing an RF power supply; and
   providing a power distribution circuit in electrical communication with an output of the power supply and the first and second coils.

14. The method of claim 12, wherein regulating the magnetic field intensity comprises controlling a ratio of an electrical current supplied to the first and second coils.

15. The method of claim 14, wherein controlling a ratio of an electrical current further comprises varying a capacitive component in a power distribution network, wherein the value of the reactive component is directly related to the ratio of electrical current.

16. The method of claim 12, wherein regulating the magnetic field intensity comprises adjusting a separation distance between the first and second coils and the workpiece.

17. The method of claim 12, further comprising providing a controller configured to selectively vary the magnetic field intensity in accordance with a predefined semiconductor processing recipe.

18. The method of claim 17, wherein the controller is a microprocessor based system configured to execute a control program that generates output signals that may be used to control processing parameters of a semiconductor processing system in accordance with a processing recipe.

19. The method of claim 17, wherein the controller is a manually actuated controller.

20. The method of claim 12, wherein positioning the first and second coils comprises affixing the first coil to a first plurality of selectively movable vertical mounting posts and affixing the second coil to a second plurality of selectively movable vertical mounting posts, wherein the first plurality of vertical mounting posts are movable independent of the second plurality of vertical mounting posts.

21. The method of claim 14, wherein controlling the ratio of the electrical current supplied to the first and second coils comprises adjusting the current ratio within a recipe step.

22. A method for varying plasma uniformity in a semiconductor processing chamber having at least a first and second coils positioned above the chamber, comprising:
   supplying a first electrical current to the first coil;
   supplying a second electrical current to the second coil; and
   varying a capacitive element in a power distribution network to control a ratio of the first electrical current to the second electrical current.

23. The method of claim 22, wherein controlling the current ratio comprises:
   receiving power in the power distribution network from an RF power supply; and
   adjusting a reactive component in the power distribution network to control the ratio of current applied to the first and second coils.

24. The method of claim 22, wherein controlling the ratio further comprises maintaining processing parameters constant, wherein process parameters include at least one of a total power applied to the combination of the first and second coils, a pressure in the processing chamber, and a process gas flow into the process chamber.

25. The method of claim 22, wherein controlling the ratio further comprises using a microprocessor based controller configured to store a processing recipe and generate control signals configured to execute the processing recipe in the processing recipe in the processing chamber.

26. The method of claim 22, wherein controlling the ratio further comprises manually adjusting an element in the power distribution network to vary a current ratio applied to the first and second coils.

27. The method of claim 22, wherein controlling the ratio comprises adjusting the plasma uniformity at least once within a recipe step duration.

28. The method of claim 27, wherein adjusting the plasma uniformity comprises changing between at least two of an edge high plasma uniformity condition, a center high plasma uniformity condition, and a uniform plasma condition within a recipe step duration.

29. The method of claim 28, wherein the edge high plasma uniformity condition corresponds to a current ratio of x:y, wherein x represents the current supplied to an outer coil and y represents the current supplied to an inner coil, and x>y.

30. The method of claim 28, wherein the center high plasma uniformity condition corresponds to a current ratio of x:y, wherein x represents the current supplied to an outer coil and y represents the current supplied to an inner coil, and x<y.

31. The method of claim 28, wherein the uniform plasma condition corresponds to a current ratio of x:y, wherein x represents the current supplied to an outer coil and y represents the current supplied to an inner coil, and x is approximately equal to y.

* * * * *

UNITED STATES PATENT AND TRADEMARK OFFICE
CERTIFICATE OF CORRECTION

PATENT NO.  : 6,617,794 B2
DATED       : September 9, 2003
INVENTOR(S) : Barnes et al.

It is certified that error appears in the above-identified patent and that said Letters Patent is hereby corrected as shown below:

Column 4,
Line 56, please change "coil 54" to -- coil 154 --.

Column 5,
Line 25, please change "than on coil" to -- than one coil --.

Column 9,
Line 19, please change "heating ]]coil" to -- heating coil --.

Signed and Sealed this

Third Day of February, 2004

JON W. DUDAS
*Acting Director of the United States Patent and Trademark Office*